(12) United States Patent
Creviston et al.

(10) Patent No.: US 9,661,789 B2
(45) Date of Patent: May 23, 2017

(54) COOLING AIR ROUTING FOR ELECTRONICS HEAT REMOVAL

(71) Applicant: Remy Technologies, LLC, Pendleton, IN (US)

(72) Inventors: Alex Creviston, Muncie, IN (US); Chris Bledsoe, Anderson, IN (US)

(73) Assignee: Remy Technologies, LLC, Pendleton, IN (US)

( * ) Notice: Subject to any disclaimer, the term of this patent is extended or adjusted under 35 U.S.C. 154(b) by 298 days.

(21) Appl. No.: 14/160,938

(22) Filed: Jan. 22, 2014

(65) Prior Publication Data

US 2015/0208528 A1 Jul. 23, 2015

(51) Int. Cl.
*H02K 11/00* (2016.01)
*H05K 7/20* (2006.01)
*H02K 11/04* (2016.01)

(52) U.S. Cl.
CPC ....... *H05K 7/20918* (2013.01); *H02K 11/048* (2013.01)

(58) Field of Classification Search
CPC .................................................. H02K 11/046
See application file for complete search history.

(56) References Cited

U.S. PATENT DOCUMENTS

| | | | | |
|---|---|---|---|---|
| 5,729,063 A * | 3/1998 | Adachi | ................ | H02K 11/046 310/64 |
| 5,949,166 A * | 9/1999 | Ooiwa | ................ | H02K 11/046 310/58 |
| 6,525,438 B1 * | 2/2003 | Asao | ...................... | H01L 25/115 310/64 |
| 6,724,108 B2 * | 4/2004 | Nakano | ................ | H02K 19/365 310/64 |
| 6,734,587 B2 * | 5/2004 | Hirsou | ...................... | H02K 5/15 310/52 |
| 7,378,766 B2 | 5/2008 | Vasilescu et al. | | |
| 7,417,857 B2 | 8/2008 | Rondier et al. | | |
| 8,042,993 B2 | 10/2011 | Van Maanen | | |
| 8,138,640 B2 * | 3/2012 | Urano | ...................... | H02K 9/19 310/260 |
| 8,232,637 B2 | 7/2012 | Beaupre et al. | | |
| 2008/0061641 A1 * | 3/2008 | Koumura | ............. | H02K 11/046 310/71 |

(Continued)

*Primary Examiner* — Dang Le
(74) *Attorney, Agent, or Firm* — Bose McKinney & Evans LLP

(57) ABSTRACT

An alternator includes a housing body, and an electronics chassis electrically in common with output voltage (B+) of the alternator, conductively isolated from heat of the housing body, and having cooling fins. An air router intermediate the housing body and the chassis directs cooling air from air intake openings to the cooling fins. An electric machine includes a housing with air intake openings, an electronics chassis having rectifier electronics mounted thereon and having axially-extending cooling fins, and an air router secured intermediate the housing body and the electronics chassis, for routing the cooling air from the air intake openings directly to the cooling fins. An alternator includes a housing, an electronics chassis electrically in common with (B+), air intake openings, and an air router secured intermediate the housing body and the electronics chassis, the air router structured for routing air from the air intake openings directly to the electronics chassis.

20 Claims, 14 Drawing Sheets

(56) References Cited

U.S. PATENT DOCUMENTS

| | | |
|---|---|---|
| 2008/0197726 A1 | 8/2008 | Dubuc et al. |
| 2008/0197727 A1 | 8/2008 | Dubuc et al. |
| 2010/0117466 A1 | 5/2010 | Gas et al. |
| 2012/0326572 A1* | 12/2012 | Konaya ................ H02K 11/046 310/60 R |

* cited by examiner

COOLING AIR ROUTING FOR ELECTRONICS HEAT REMOVAL

BACKGROUND

The disclosed embodiments are directed to improving efficiency and reliability of an electric machine and, more particularly, to improving cooling of rectifier electronics.

Alternators convert mechanical energy into electrical energy for a vehicle. The rotor of an automotive alternator is typically driven by a belt and pulley system to rotate within stator windings coiled on a laminated iron frame. The magnetic field from the spinning rotor induces an alternating voltage into the stator windings. The alternating voltage (AC) is typically then converted to a direct current (DC) voltage by a rectifying circuit that outputs the DC voltage to one or more batteries and to electrical devices of a vehicle.

A rectifying circuit may be formed using diodes, MOS-FET devices, or by other structure. The rectifying circuit and associated control components may be located in an alternator housing.

Modern automotive alternators are generally required to supply ever-greater amounts of electrical current. For example, hybrid and electric vehicles may use electricity instead of internal combustion for driving the wheels, and an alternator may be combined with a starter in a mild hybrid configuration such as in a belt alternator starter (BAS) system. Other electrical loadings from air conditioning, electric power steering, and various vehicle systems further increase the required alternator electrical generation capacity. As a result, efficiency of automotive alternators needs to be optimized. Efficiency is generally limited by fan cooling loss, bearing loss, iron loss, copper loss, and the voltage drops in the rectifier bridges. The use of permanent magnets may increase efficiency by providing field flux without relying on a wound field that inherently creates ohmic losses. An alternator may have dual internal fans to improve operating efficiency and durability and to reduce heat-related failures. Many conventional alternator systems are addressed to such concerns. However, additional improvements are desirable.

Available space within a motor vehicle engine compartment is limited as manufacturers strive to reduce the size of vehicles while maximizing power and efficiency. With multiple components packed in a relatively small space, the heat generated by a number of devices increases the ambient temperature within the engine compartment. In addition, a tightly packed engine compartment may have limited space available for the flow of cooling air to reduce component temperatures. Excessive engine compartment temperatures may adversely affect alternator performance, including performance of individual components thereof.

SUMMARY

It is therefore desirable to obviate the above-mentioned disadvantages by providing an air routing apparatus and method for directing cooling air within an electric machine such as an automotive alternator.

According to an exemplary embodiment, an alternator includes a housing body, and an electronics chassis electrically in common with positive DC output voltage (B+) of the alternator, conductively isolated from heat of the housing body, and having integrally-formed cooling fins. The alternator has a plurality of air intake openings, and an air router secured intermediate the housing body and the electronics chassis, the air router being structured for directing cooling air from the air intake openings to the cooling fins.

According to another exemplary embodiment, an electric machine includes a housing body having a plurality of cooling air intake openings around its perimeter, and an electronics chassis attached to an axial end of the housing body, the chassis having rectifier electronics mounted thereon and having integrally-formed, axially-extending cooling fins. The electric machine has an air router secured intermediate the housing body and the electronics chassis, the air router being structured for routing the cooling air from the air intake openings directly to the cooling fins.

According to a further exemplary embodiment, an alternator includes a housing body, an electronics chassis electrically in common with positive DC output voltage (B+) of the alternator, a plurality of air intake openings, and an air router secured intermediate the housing body and the electronics chassis, the air router being structured for routing cooling air from the air intake openings directly to the electronics chassis.

The foregoing summary does not limit the invention, which is defined by the attached claims. Similarly, neither the Title nor the Abstract is to be taken as limiting in any way the scope of the claimed invention.

BRIEF DESCRIPTION OF THE DRAWING FIGURES

The above-mentioned aspects of exemplary embodiments will become more apparent and will be better understood by reference to the following description of the embodiments taken in conjunction with the accompanying drawings, wherein.

Corresponding reference characters indicate corresponding or similar parts throughout the several views.

DETAILED DESCRIPTION

The embodiments described below are not intended to be exhaustive or to limit the invention to the precise forms disclosed. Rather, the embodiments are chosen and described so that others skilled in the art may appreciate and understand the principles and practices of these teachings.

Figure 1:
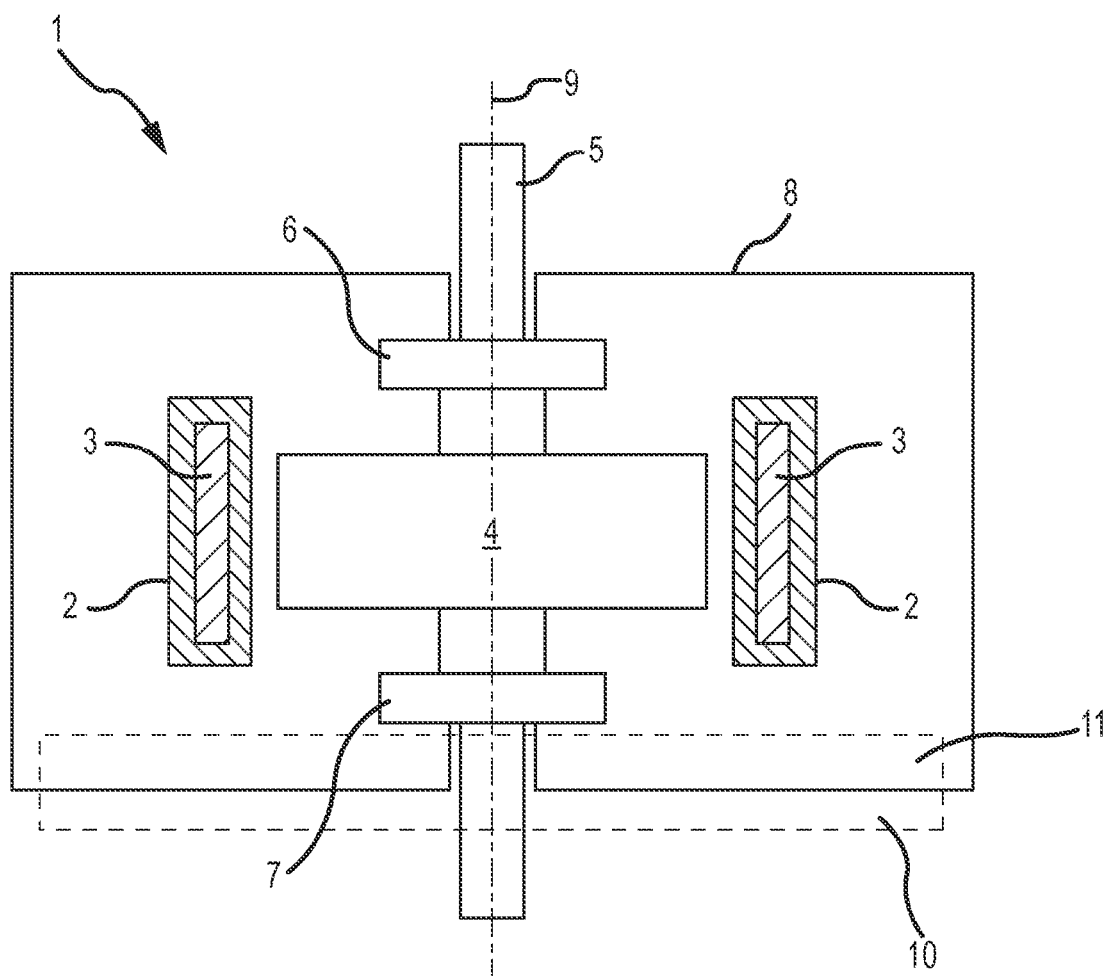
FIG. 1 is a schematic view of an exemplary electric machine.

FIG. 1 is a schematic view of an exemplary electric machine 1 having a stator 2 that includes stator windings 3 such as one or more coils. An annular rotor body 4 may also contain windings and/or permanent magnets and/or conductor bars such as those formed by a die-casting process. Rotor 4 includes an output shaft 5 supported by a front bearing assembly 6 and a rear bearing assembly 7. Bearing assemblies 6, 7 are secured to a housing 8. Typically, stator 2 and rotor 4 are substantially cylindrical in shape and are concentric with a central longitudinal axis 9. Although rotor 4 is shown radially inward of stator 2, rotor 4 in various embodiments may alternatively be formed radially outward of stator 2. Electric machine 1 may be a motor/generator or other device. In an exemplary embodiment, electric machine 1 may be an alternator. Housing 8 may have a plurality of longitudinally extending fins (not shown) formed to be spaced apart from one another on a housing external surface for dissipating heat produced in the stator windings 3. An external electronics space 10 may be provided adjacent an axial end of housing 8 and/or an internal electronics space 11 may be provided within housing 8 for containing rectifying circuitry, control circuitry, and other associated components.

Figure 2:
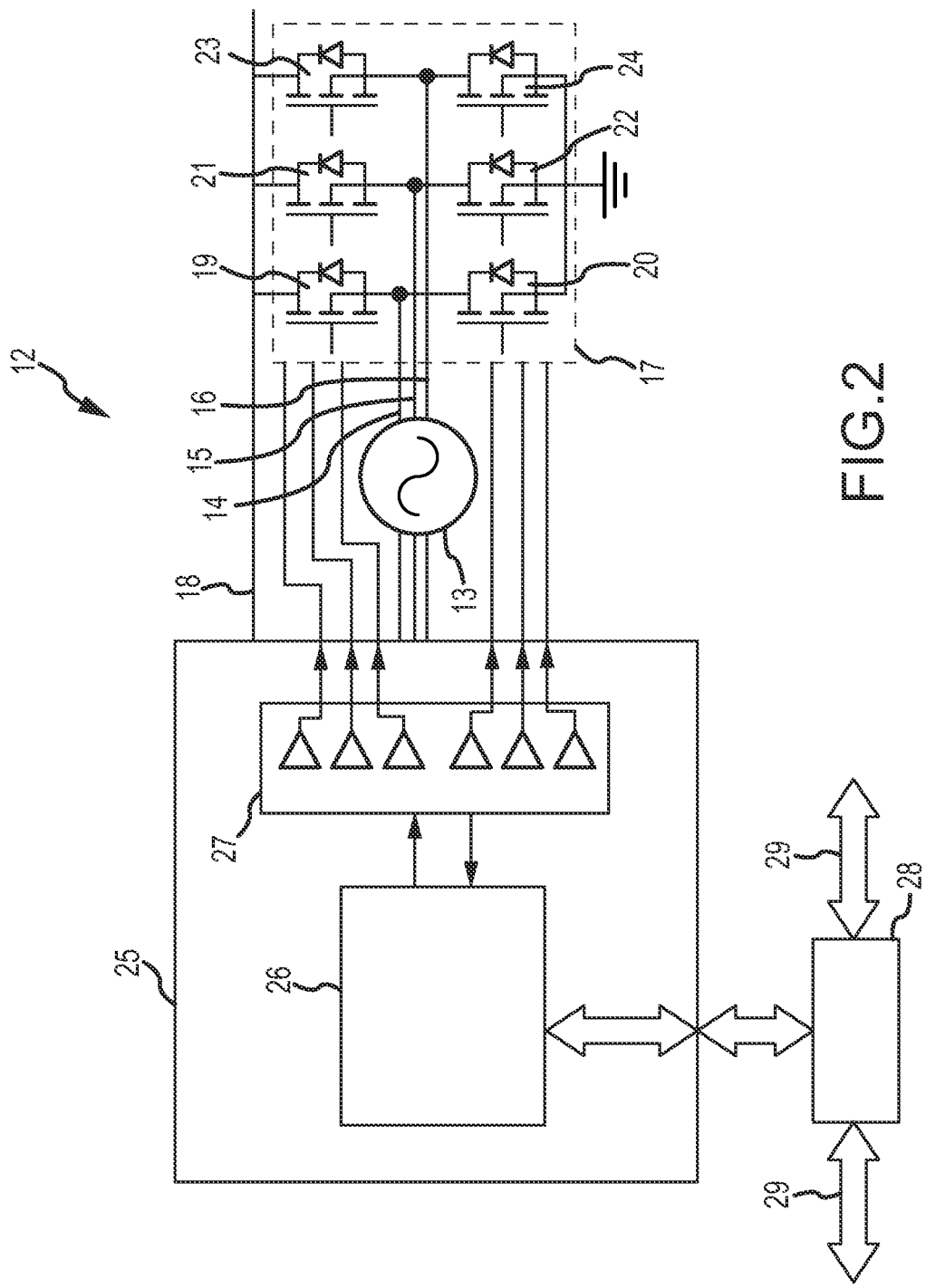
FIG. 2 is a simplified electrical schematic of an exemplary electronics circuit for a three-phase alternator.

FIG. 2 is a simplified electrical schematic of an exemplary electronics circuit 12 for a three-phase alternator 13. Alternator 13 outputs alternating current (AC) voltages at respective phase leads 14, 15, 16. Phase leads 14-16 are each connected to a separate half-bridge rectifier within a rectifier circuit 17 that converts the AC phase voltages into a DC voltage provided to a DC bus 18. In the illustrated embodiment, each half-bridge includes a high-side MOSFET acting as a positive rectifying device, i.e., electrically between a respective phase lead and DC bus 18, and a low-side MOSFET acting as a negative rectifying device, i.e., electrically between a respective phase lead and ground potential, whereby phase lead 14 connects to the Source of high-side MOSFET circuit 19 and to the Drain of low-side MOSFET circuit 20, phase lead 15 connects to the Source of high-side MOSFET circuit 21 and to the Drain of low-side MOSFET circuit 22, and phase lead 16 connects to the Source of high-side MOSFET circuit 23 and to the Drain of low-side MOSFET circuit 24. In various embodiments, any of MOSFET circuits 19-24 may be an N-channel device or a P-channel device. MOSFET circuits 19-24 typically include a free-wheeling diode as shown. Although MOSFET circuits 19-24 are illustrated as being single devices, each may include any number of MOSFET devices. For example, each MOSFET circuit 19-24 may include several MOSFET devices connected in parallel, whereby all Gate terminals are connected, all Drain terminals are connected, and all Source terminals are connected together. In such a case, a higher current capacity may be obtained for each MOSFET circuit 19-24.

A control circuit 25 controls rectifier 17 and other devices, and includes a control block 26 and MOSFET drivers 27. Control circuit 25 may receive various signals from sensors (not shown), phase signals 14-16, and control signals, and may transmit control and information signals for implementing various functions, including functions for controlling alternator operation. Control circuit 25 may be configured to communicate with one or more remote device(s) such as a microcontroller 28 that, in turn, is in communication with other remote devices (not shown) via one or more analog or digital bus circuit(s) 29. Control circuit 25 typically does not generate significant heat, but the various components are susceptible to damage from being exposed to excessive ambient temperature.

The operation and configuration of circuit 12 may be modified depending upon the particular alternator application. For example, control circuit 25 may be coupled to an external power supply, rectifier circuit 17 may include any number of MOSFETs, diodes, and other components. The term "MOSFET" has become somewhat generic. For example, the previously metal gate material is now often a layer of polysilicon (polycrystalline silicon). As used herein, a MOSFET may also refer an insulated-gate field-effect transistor (IGFET).

Figure 3:
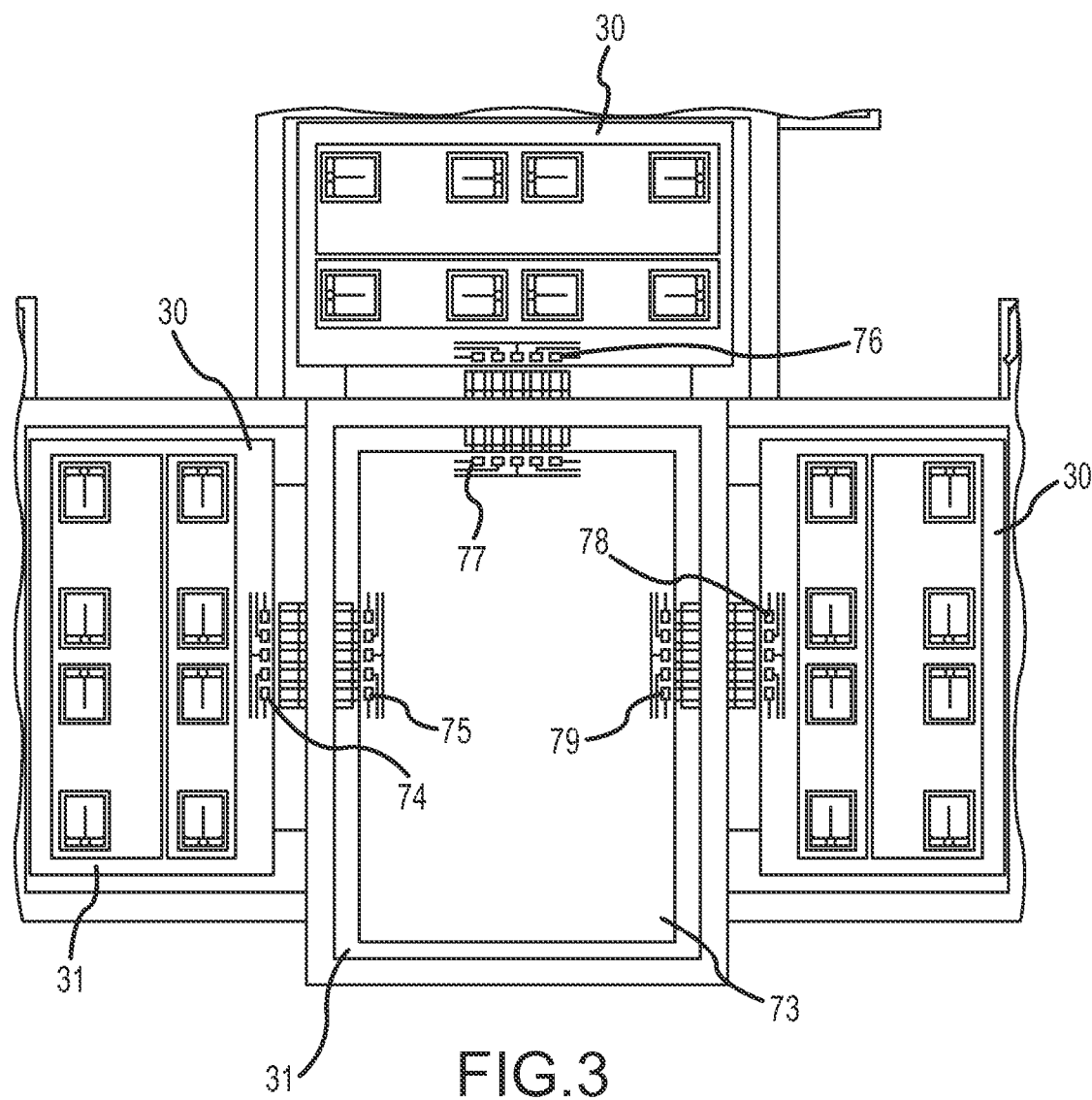
FIG. 3 is a top plan view of an exemplary general layout for rectification and control electronics of a three phase alternator.

FIG. 3 is a top plan view of an exemplary general layout for rectification and control electronics of a three phase alternator. Each phase has a separate rectifier circuit 30. A control circuit 73 is electrically connected to each of the three rectifier circuits 30 and controls all functions thereof. For convenience, terminals of each rectifier circuit 30 are now referred to collectively, for each phase. For example, a rectifier circuit 30 for phase A has terminals 74 that are jumpered by bonded wires to corresponding phase A terminals 75 of control board 73, a rectifier circuit 30 for phase B has terminals 76 that are jumpered by bonded wires to corresponding phase B terminals 77 of control board 73, and a rectifier circuit 30 for phase C has terminals 78 that are jumpered by bonded wires to corresponding phase C terminals 79 of control board 73. Control board 73 may have a basic configuration such as that shown by example as control circuit 25 in FIG. 2, or it may have an alternative form. MOSFETs are typically not mounted directly to the ceramic substrates but are, instead, secured thereto with individual copper-invar-copper heat spreaders (not shown) each having a height of approximately 0.008 inch.

Figure 4:
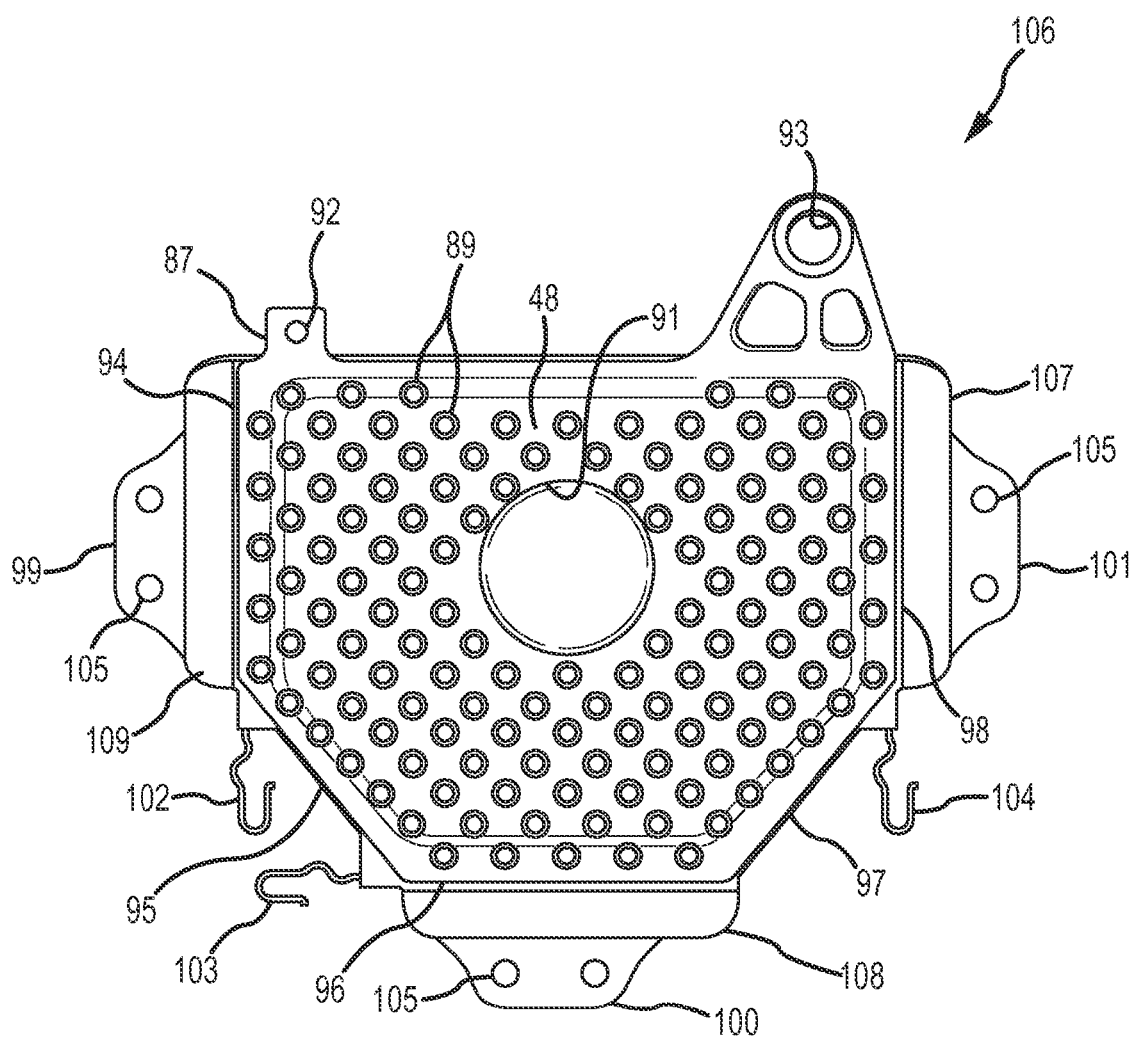
FIG. 4 is a plan view of the heat exchange side of an electronics chassis assembly that includes an electronics chassis, according to an exemplary embodiment.

FIG. 4 is a plan view of the heat exchange side of an electronics chassis assembly 106 that includes electronics chassis 87, according to an exemplary embodiment. Chassis 87 may be formed of aluminum or another electrically conductive material. Aluminum is typically used because of its light weight and adaptability to connection structure such as brazed or wire-bonded electrical joints. Electronics chassis 87, as described further below, is connected to the DC voltage (B+) potential. An array of heat sink pins 89 are integrally formed to axially extend from surface 88 of aluminum electronics chassis 87. A center feature 91, such as an indentation or a projection, may be provided to allow clearance for an adjacent structure such as a hub or shaft assembly. B+ chassis surface 88 may include one or more B+ connection hole(s) 92 that may be formed for electrically connecting and structurally accommodating associated terminals (not shown), fasteners, wires, and the like. A B+ bore 93 may have a diameter slightly less than the diameter of B+ terminal post 81 (FIG. 4), whereby post 81 may be interference fit into bore 93 during assembly and thereby effect a B+ electrical connection. Such B+ connection may also include a brazed or welded joint, or it may simply be effected through conductive fasteners such as one or more metal nut(s) (not shown) fastened onto post 81 and thereby held against chassis 87. B+ surface 88 may have peripheral outer edges 94-98 that are contiguous with one or more electrically insulating portion(s) that secure ground and phase potentials in close proximity to edges 94-98. Aluminum ground tabs 99-101, copper phase connections 102-104, and electronics chassis 87 are all joined together with an electrically insulating material such as plastic, whereby ground and multiple phase potentials are placed in proximity to the B+ potential of electronics chassis 87. Ground tabs 99-101 each have mounting holes 105 for mounting electronics chassis assembly 106 to an alternator housing 80 at corresponding threaded receptacles (not shown) formed therein. Copper phase connections 102-104 may be copper leads that are brazed or welded to aluminum terminal posts having connection pads (described further below) and these copper to aluminum joints are each typically enclosed within respective plastic over mold portions 107-109.

Figure 5:
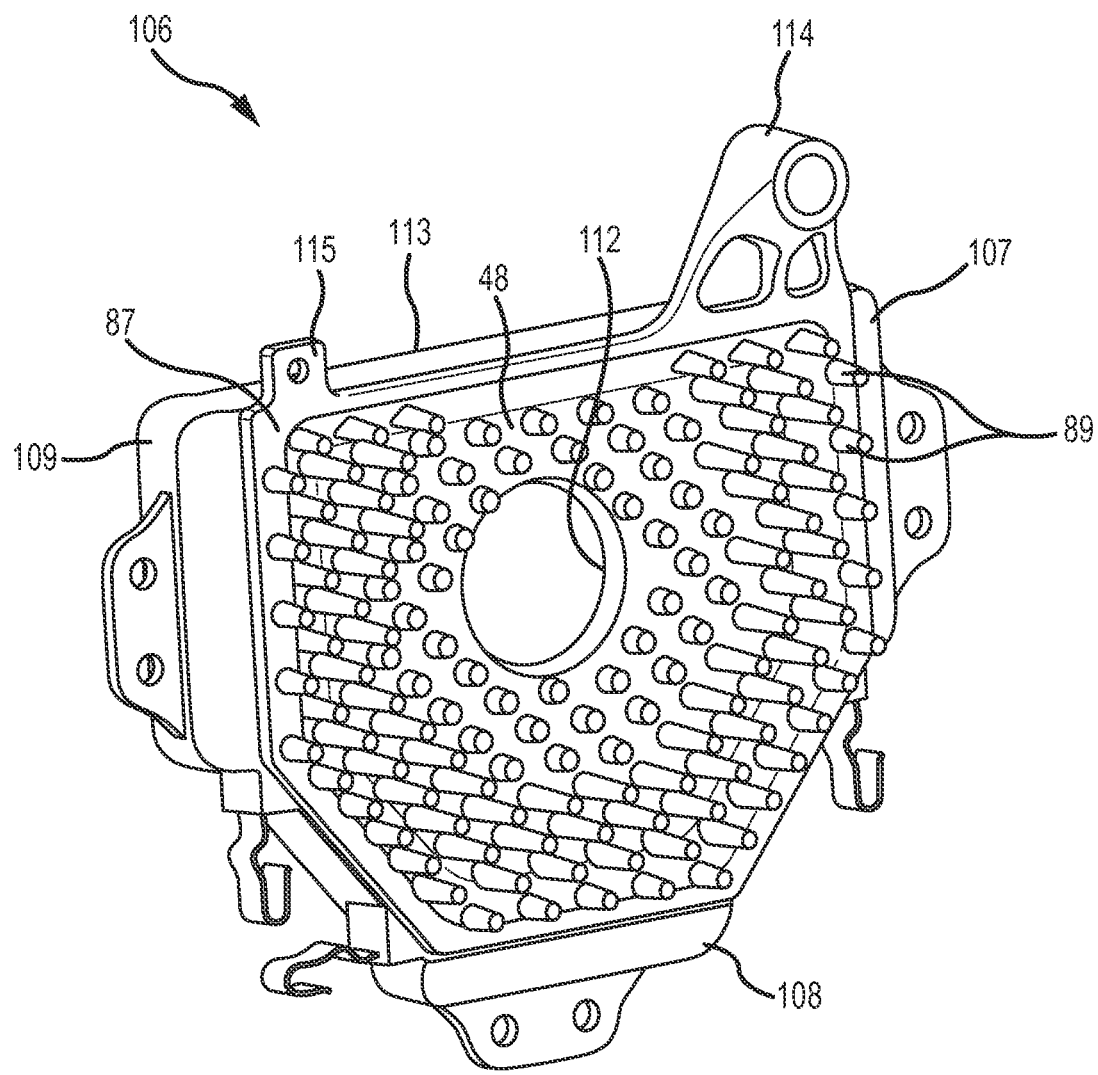
FIG. 5 is a perspective view of the heat exchange side of an electronics chassis assembly, according to an exemplary embodiment.
Figure 11:
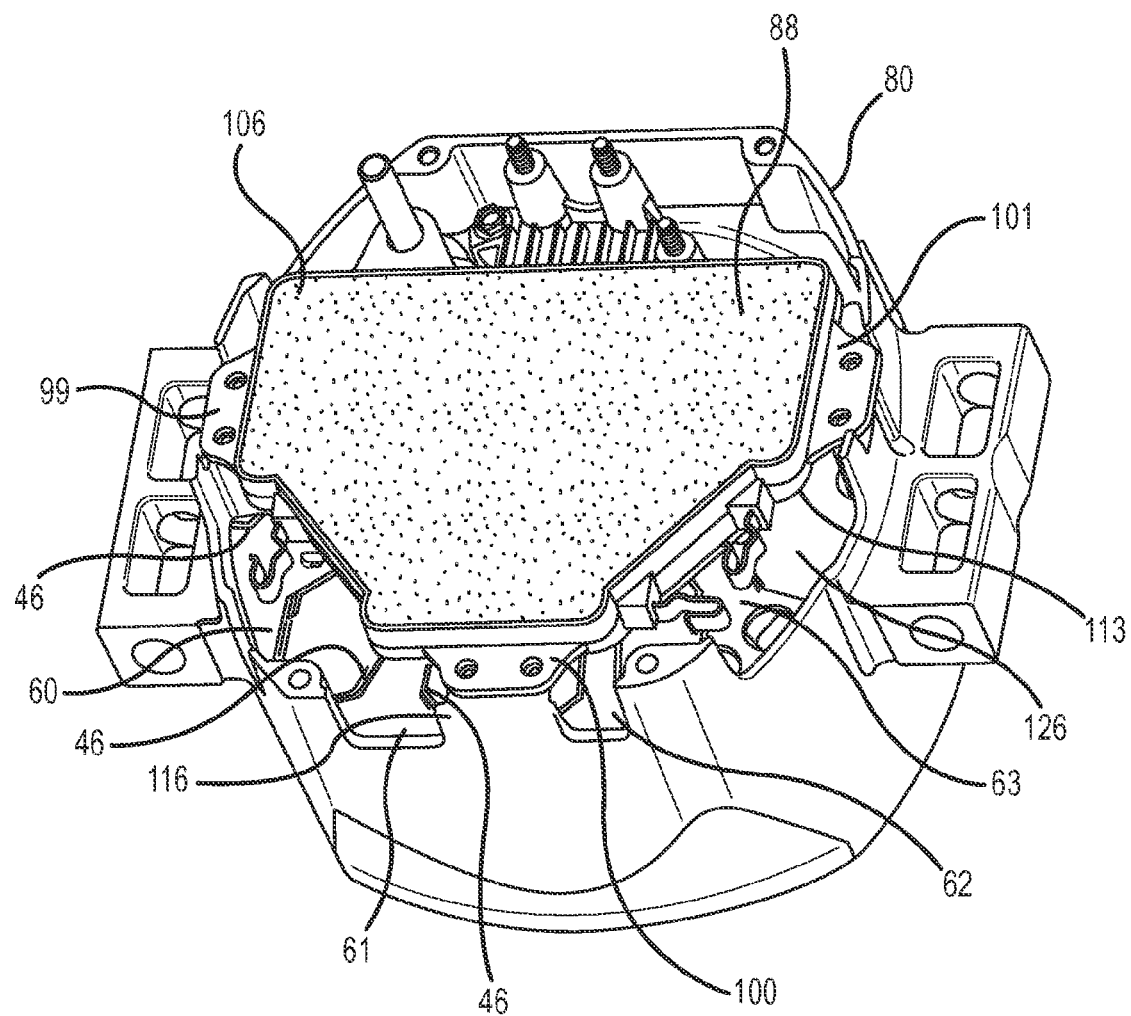
FIG. 11 is a perspective view of an electronics chassis assembly placed into position for securement to an alternator housing, according to an exemplary embodiment.

FIG. 5 is a perspective view of the heat exchange side of electronics chassis assembly 106, according to an exemplary embodiment. An array of heat sink pins 89 is integrally formed to axially extend from surface 48 of aluminum electronics chassis 87. Heat sink pins 89 have various heights that depend on the proximity of adjacent structure within a housing 80 (FIG. 11). Since pins 89 and other portions of electronics chassis 87 are at B+ potential, the heights of pins 110 are chosen to avoid shorting or otherwise contacting pins 110 with other components or ground. A center recess 112 is provided to accommodate axial projection of a hub or shaft assembly (not shown) when assembly 106 is mounted to housing 80. Plastic over mold portion 113 includes over mold portions 107-109 and encloses ground tabs 99-101 (FIG. 5) and phase leads 102-104 for structurally integrating such tabs and leads with B+ chassis 87 while preventing electrical conduction between different potentials. The B+ terminal post receiving portion 114 and the B+ terminal portion 115 may be formed at any appropriate locations along the perimeter of electronics chassis 87.

Figure 6:
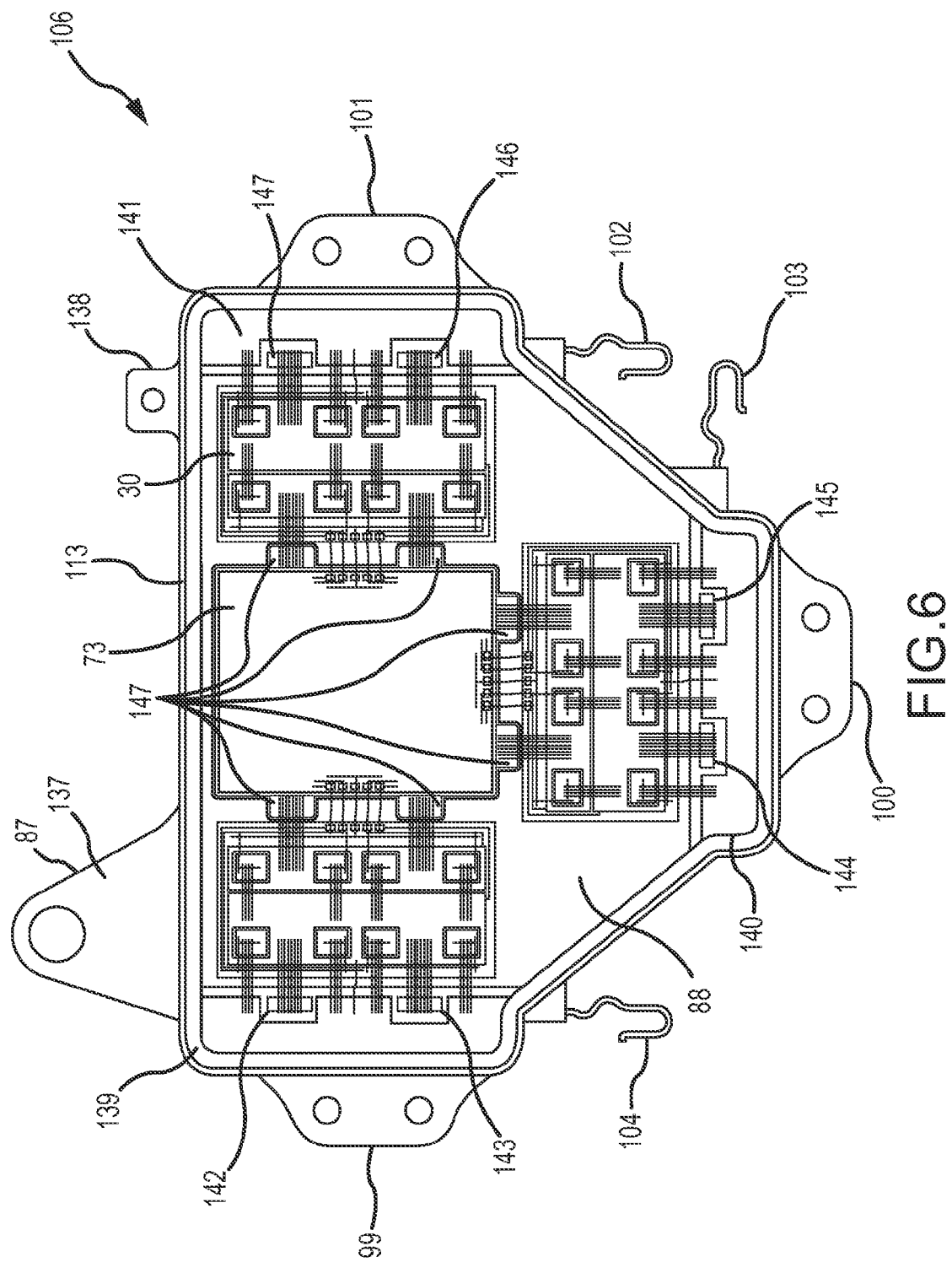
FIG. 6 is a top plan view of a B+ electronics chassis assembly showing ground, phase, and B+ potentials being fed to power electronics boards and a central control circuit, according to an exemplary embodiment.

FIG. 6 is a top plan view of a B+ electronics chassis assembly 106 showing ground, phase, and B+ potentials being fed to power electronics boards 30 and central control circuit 73, according to an exemplary embodiment. Electronics chassis 87 is at B+ potential. Surfaces 88, 137, 138 are integral portions of chassis 87 and are, therefore, also at B+ potential. Ground tabs 99-101 are integral with exposed ground surfaces 139-141, all at ground potential. Phase connection pads 142, 143 are aluminum and are joined by brazing to copper phase connection 104. Phase connection pads 144, 145 are aluminum and are joined by brazing to copper phase connection 103. Phase connection pads 146, 147 are aluminum and are joined by brazing to copper phase connection 102. Such brazed connections are typically enclosed within plastic over mold 113. Ground surfaces 139-141, phase connection pads 142-147, and electronics mounting surface 88 of electronics chassis 87 are all substantially coplanar so that bonding wires from various portions of electronics boards 30 and from control circuit 73 may be easily attached thereto. In addition, any associated attachment locations may be machined or otherwise prepared to provide reliable wire bonding surfaces. For example, electronics mounting surface 88 includes machined B+ wire bonding pads 147.

In operation, there may be a difference in temperature of as much as fifteen degrees Celsius between a MOSFET junction and the bottom of electronics substrate 31 (FIG. 3), such as when substrate 31 is approximately 96% alumina and has a thermal conductivity of twelve to fifteen W/m·K and a thickness of about 0.025 inches. Thermal conductivity may be improved by forming substrate 31 of nitride type ceramics. Thermally conductive adhesive may be used for bonding substrate 31 to electronics mounting surface 88. Aluminum chassis 106 may, for example, have a 8 mm nominal thickness apart from locations having heat sink pins 89.

Figure 7:
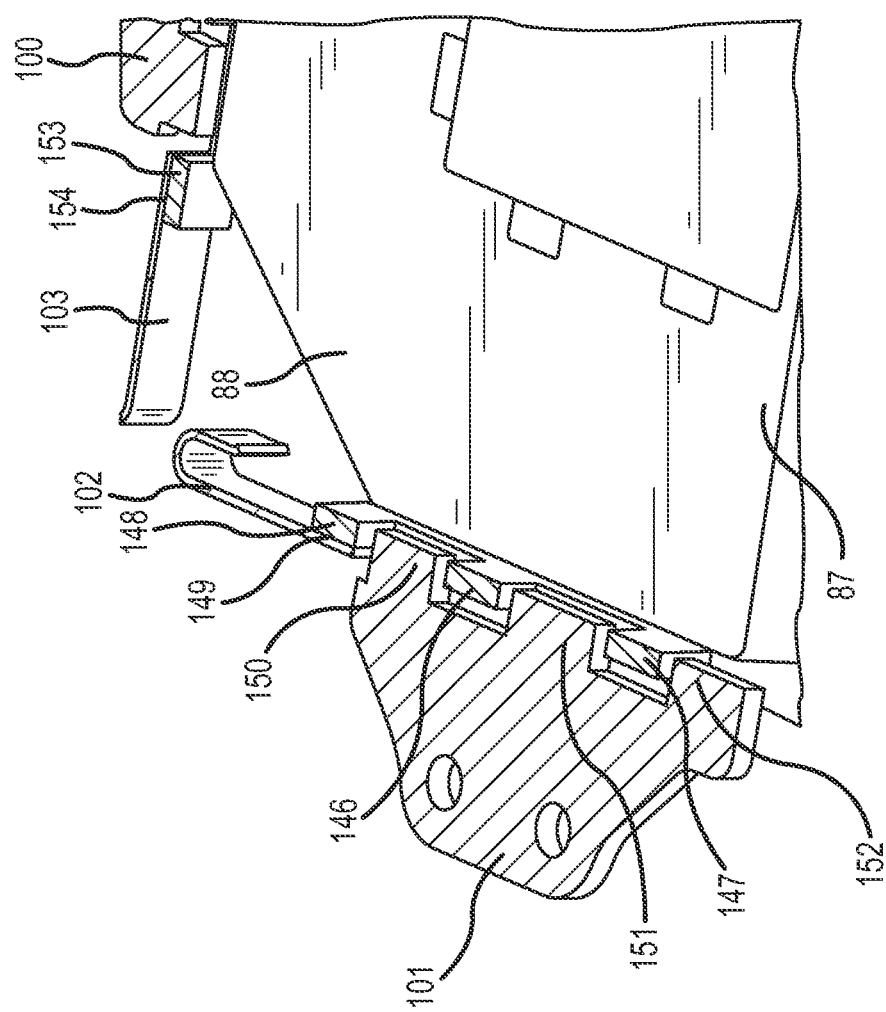
FIG. 7 is a partial perspective view showing a welded bimetal phase lead before such structure is partially covered in a plastic over-mold, according to an exemplary embodiment.

FIG. 7 is a partial perspective view showing a welded bimetal phase lead before such structure is partially covered in a plastic over-mold, according to an exemplary embodiment. The phase lead has a copper phase connection portion 102 (FIG. 6) and an aluminum phase manifold structure 148 joined together at a welded/brazed joint 149. Phase lead manifold 148 is integrally formed to include phase pads 146, 147 that may have polished or machined surfaces suitable for wire bonding to an adjacent circuit 30 located on electronics mounting surface 88 of chassis 87. Phase pads 146, 147 are interposed, such as by being interdigitated, between ground pads 150-152 of ground tab 101. The tops of pads 146, 147, 150-152 may be substantially coplanar with electronics chassis surface 88. In like manner, copper phase connection 103 and an aluminum phase manifold structure 153 are joined together at a welded/brazed joint 154.

Figure 8:
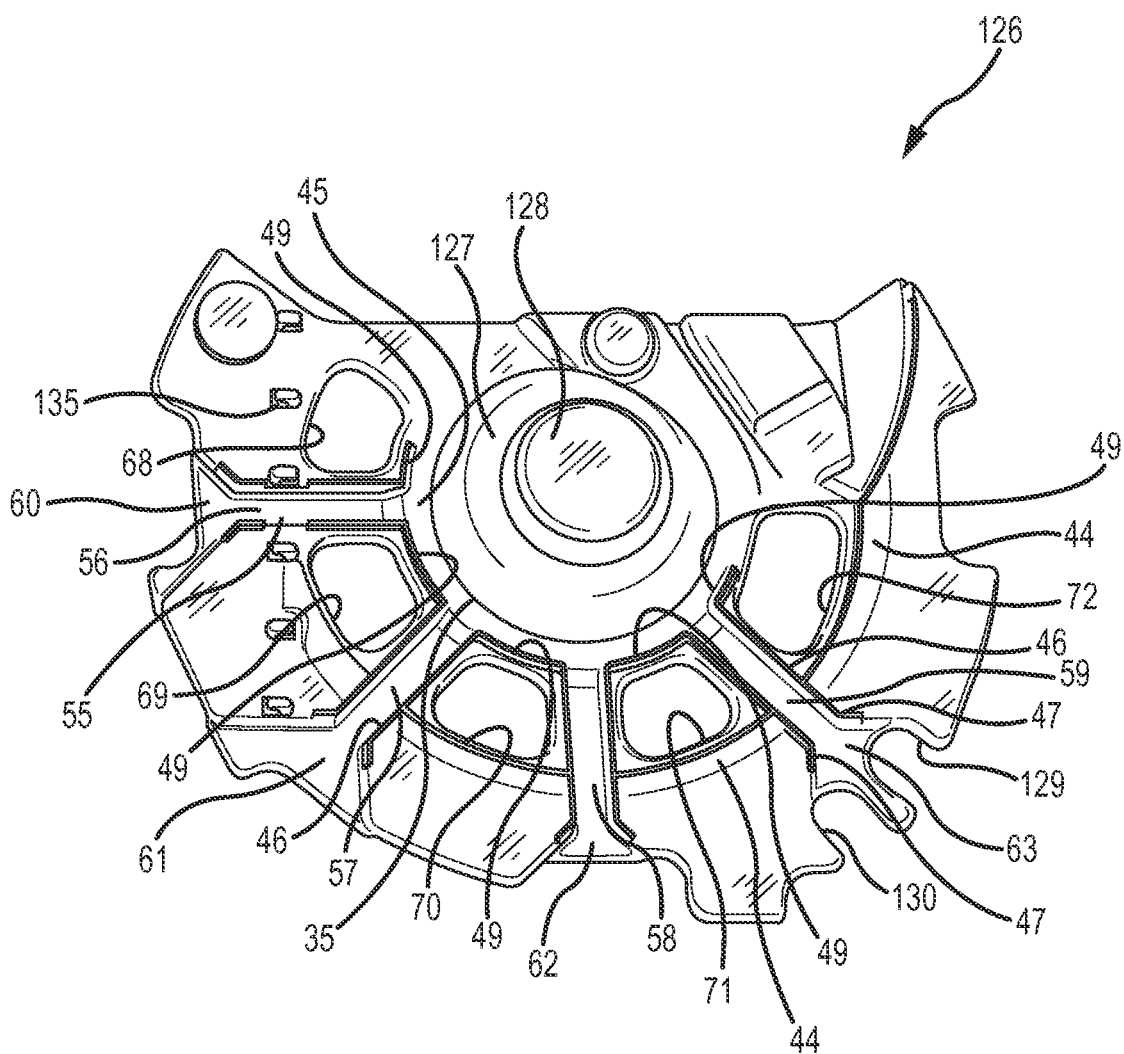
FIG. 8 is a perspective view of an air router, according to an exemplary embodiment.

FIG. 8 is a perspective view of an air router 126, according to an exemplary embodiment. Air router 126 may be formed of relatively thin plastic, and is placed between an electronics chassis 87, 125 (FIG. 9) and an axial end of housing 80. Air router 126 may have respective first and second raised portions 127, 128 formed in a center thereof, for spatially accommodating an underlying hub and/or shaft assembly of an alternator. Air router 126 may include openings 129, 130 structured for accessing and/or spatially accommodating additional components such as phase terminal posts. Cooling air bypass channels 56-59 extend radially inward from respective air intake openings 60-63 to a center space 45. Channels 56-59 are each formed with axially extending walls 46 between respective flared portions 47 and center portions 49. Openings 68-72 are formed adjacent cooling air bypass channels 56-59. Additional features such as clips 135 and others, may be formed in channels 56-59.

Air intake openings 60-63, as described further below, are aligned with air inlets formed about a circumference of a housing 8 (FIG. 1), whereby incoming cooling air flow initially travels substantially orthogonally with respect to a center axis 9. As the cooling air travels substantially radially, a portion of such flow may bend in a transverse direction through any break(s) 55 or partitions along a given channel. In addition, a portion of the cooling air flowing through channels 56-59 may exit a given channel by traveling axially over a corresponding channel wall 46. Incoming air that somehow fails to travel through an air bypass channel is restricted by air dams 44, whereby such attenuation further causes most incoming air to travel through cooling air bypass channels 56-59, at least radially past such air dams 44. Similarly, a center air dam 35 attenuates air flow exiting channels 56-59 in center space 45. Such air flow restriction increases fluid velocity, whereby cooling air flow may become more efficient and may be directed with more precision. Conversely, the spaces between air router 126 and heat transfer surface 48 (FIG. 5) have a reduced air velocity compared with velocity in channels 56-59. As discussed further below, the shapes, sizes, and relative positioning of air flow routing structure cause most of the incoming cooling air to pass through channels 56-59, exit into center portion 45, then travel generally radially outward over center portions 49, and then pass axially inward through openings 68-72. Additional features, such as clips 135 and others, may be formed in air router 126. For example, cooling air bypass channels 56-59 may be formed with sufficient precision to create some degree of coherence for portions thereof.

Figure 9:
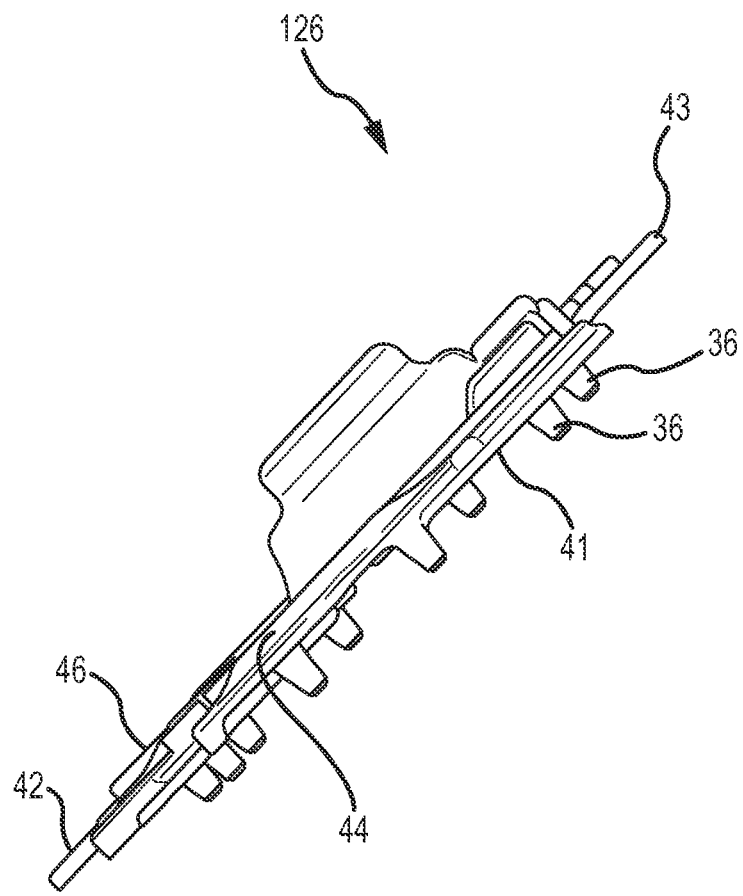
FIG. 9 is a side perspective view of the air router of FIG. 8.

FIG. 9 is a side perspective view of air router 126. A number of stand-off projections 36 extend from an axially-inward or bottom surface 41 and act to axially position air router 126 in close proximity to electronics chassis 106 and its heat sink pins 89 (FIG. 5). Air router 126 has a nominal axially-outward surface 42 providing, for example, the bottom surfaces of cooling air bypass channels 56-59. Walls 46 defining channels 56-59 may have respective portions that extend above surface 42 by varying amounts, whereby cooling air may be routed in a specific path. Air dams 44 act to block air flow and create pressure that forces a cooling air flow along a desired route. A peripheral edge 43 defines the radially outer portion of air router 126.

Figure 10:
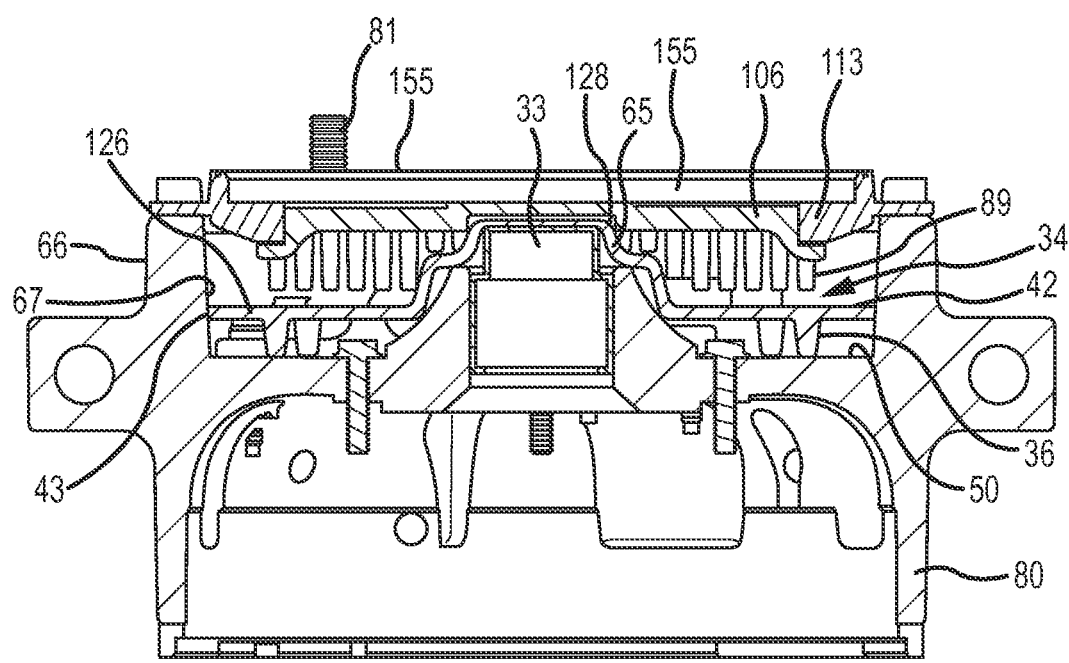
FIG. 10 is a cross-sectional elevation view of the rectifier end (RE) of an alternator, according to an exemplary embodiment.

FIG. 10 is a cross-sectional elevation view of the rectifier end (RE) of an alternator, according to an exemplary embodiment. Air router 126 is placed so that projections 36 abut an interior end surface 50 of a housing 80, and center raised portion 128 fits over the end of a shaft/hub assembly 33. Perimeter edge 43 of air router 126 abuts a corresponding inner surface 67 of housing 80 and may be sealed thereto with a sealant (not shown), gasket, or other structure. Electronics chassis 106 is held in place by plastic over-mold 113. As a result, cooling air entering housing 80 through air intake holes, described below, is forced between axially outward facing surface 42 of air router 126 and the underside of electronics chassis 106 so that such cooling air passes through a space 34 that includes heat sink pins 89. Such air flow may be generally radially inward through cooling pins 89, both within air bypass channels 56-59 and within adjacent spaces. Air pressure results in a portion of the air flow then passing over walls 46, 49 (FIG. 8) and a portion flowing directly to exit air passages 68-72. In order to prevent any stagnant air space, small holes may be formed in a center portion 65 of air router 126. Cover plates 155 and B+ post are shown for reference.

FIG. 11 is a perspective view of electronics chassis assembly 106 placed into position for securement to alternator housing 80, according to an exemplary embodiment. Fasteners (not shown) such as screws or the like may secure ground tabs 99-101 to threaded receptacles formed in respective chassis support portions 116. Electronics mounting surface 88 may be formed to include any number of machined portions for attachment of B+ bonding wires thereto, may be configured in any appropriate shape for fitment onto the axial end of housing 80, and may be structured for containing any number of electronics devices such as ceramic substrates. Electronics chassis 106 may contain any number of plastic over mold portion(s) 113 for electrically insulating phases, ground, B+ and any other electric potential(s) from one another, and for providing structural support/integrity. Air intake openings 60-63 of air router 126 are aligned with air inlets formed about a circumference of housing 80. Channel walls 46 of air router 126 may extend in any dimension. For example, portions of walls 46 may extend axially inward or outward at a given location for respectively enabling or attenuating corresponding air flow over such portions. Walls 46 may extend radially outward to abut an inner surface of housing 80. By being interposed between B+ electronics chassis 87 and surrounding metal structure, air router 126 prevents B+ chassis 87 from shorting thereto.

Figure 12:
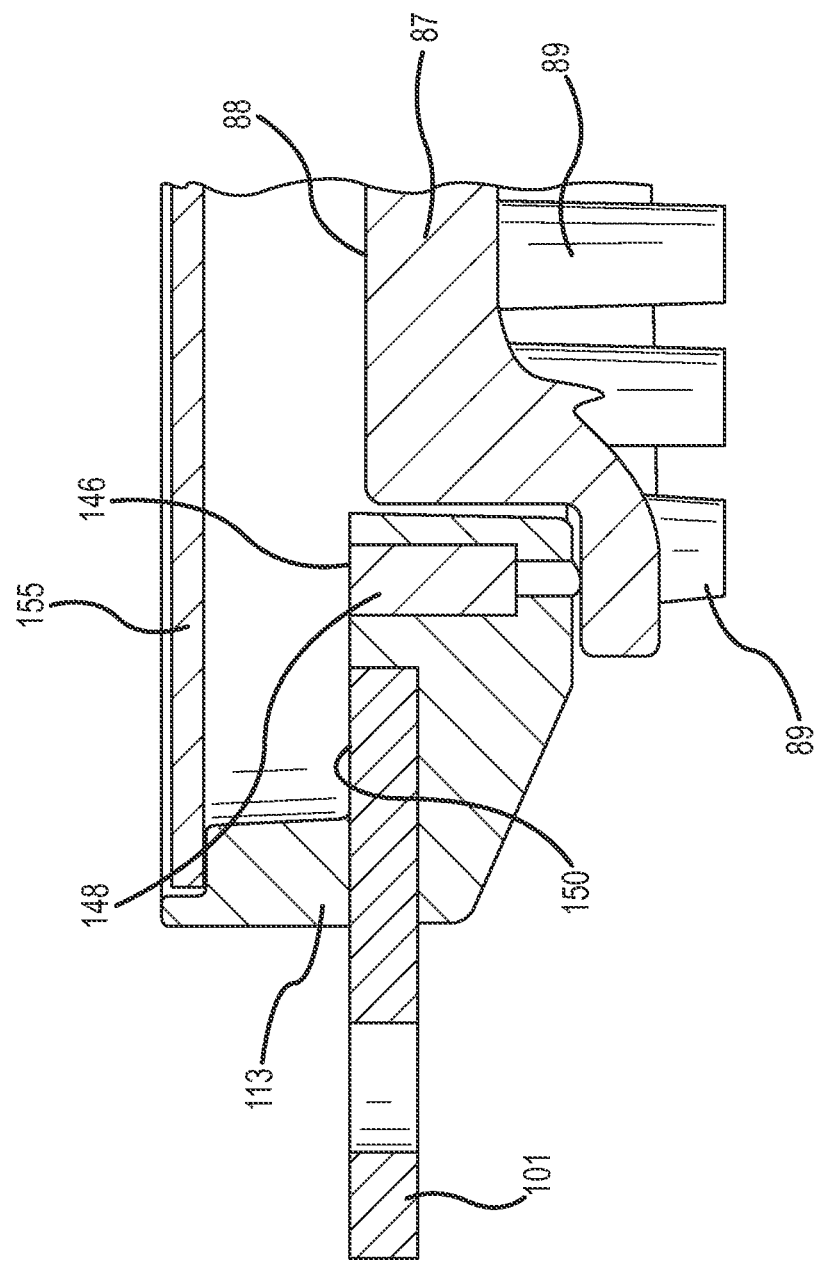
FIG. 12 is a partial view showing a cross-section through a ground tab and an aluminum phase bar, according to an exemplary embodiment.

FIG. 12 is a partial view showing a cross-section through a ground tab 101 and an aluminum phase bar 148 (FIG. 12), according to an exemplary embodiment. Wire bonding pads 146, 150 are substantially coplanar with electronics mounting surface 88 of B+ electronics chassis 87. Heat sink pins 89 of B+ electronics chassis 87 may have differing lengths, depending on proximity of adjacent structure and on desired cooling air flow through pins 89. Plastic over-mold 113 prevents electrical conduction between B+ chassis 87, phase lead manifold 148 and ground tab 101. One or more cover plate(s) 155 may be secured to an axial end of electric machine 1. Plastic over-mold 113 may be formed to electrically insulate and to provide structural support for various components, as described above.

As a result of utilizing a B+ electronics chassis that is electrically and structurally isolated from the grounded main housing of an electric machine, the electronics directly mounted on such B+ chassis are thermally decoupled from the housing. For example, since the B+ chassis may be installed into the electric machine with little or no thermal conduction between the B+ chassis and the housing, the excessive heat often generated by stator windings is not conducted into the electronics; instead, a cooling air flow may enter the electric machine and be directed by the air router and other structure to first cool the electronics and then proceed to cool the stator assembly with the convection air flow. An aluminum B+ electronics chassis may be easily formed to have an electrical current capacity well in excess of a designed peak current capacity, typically measured at the main B+ terminal post. An upper limit for current through the electronics may depend on physical limitations on the number and size of respective parallel feed-wire bonds from B+ and from ground. Multiple thick-film pads and associated conductors may also be used for increasing current capacity. Suitable aluminum may be, for example, a type 50, 52, H32, 60, 61, or other.

Each of the phase connections to the electronics may be segmented into two or more wire bonding pads, and a given phase connection may be routed around ground conductor(s) within the plastic over-mold. By having a brazed joint within the plastic over-mold, a phase connection provides a copper end adapted for a solder joint and provides one or more aluminum pads adapted for wire bonding. Typically, all plastic is formed in a single manufacturing step. A suitable plastic, for example, may be polybutylene terephthalate (PBT), polyphenylene sulfide (PPS), or other, but nylon or any other relatively strong, electrically insulating material may be used in place of plastic over-mold material. PPS may have better flow characteristics for forming plastic in locations having tight clearance space. Glass and/or fiber filler material may be included in the chosen plastic.

A reduced space and parts count, more efficient cooling, and an improved assembly for alternator electronics are provided by the disclosed embodiments. For example, ground tabs of an electronics chassis assembly may be kept very short and, therefore, such ground tabs may also be relatively thin because the associated electrical resistance is low and the tabs do not need to carry electrical current for a long distance. By maintaining the electronics on coplanar substrates directly mounted to the B+ chassis and by maintaining B+, phase, and ground connections to the electronics on the same single plane, all intra-connections' lengths may be minimized and such connections may be formed simply by vibration type wire bonding. Short wire bonds have reduced electrical resistance compared with traditional designs, and the disclosed embodiments also reduce the number of joints and interconnections compared with traditional electric machines, further reducing electrical resistance. The B+ electronics chassis eliminates otherwise lengthy B+ conductor paths and simplifies construction. For example, B+ of the electronics chassis is directly connected to the customer B+ terminal post without any additional conductor besides the traditional B+ post fastening nut (not shown).

The unitary heat sink pins of the B+ chassis improve temperature related performance characteristics of an electric machine. Such heat sink pins are thermally isolated from the heat of the adjacent housing as a result of being structurally separated from the housing and other conductive surfaces and as a result of the air router placed between the electronics heat sink and the axial end of the housing. By incorporating the heat sink into the electronics mounting chassis, surface area of the electronics chassis being used for convective heat transfer, and corresponding usage/accounting of the aluminum material, is substantially increased. For example, the convection air flow may be provided by one or more fans (not shown) located within the housing and/or externally of the housing, depending on the particular alternator configuration. By the disclosed embodiments, the conductive heat transfer path between the electronics and the housing is substantially eliminated. In addition, cooling air flow is routed through cooling pins of the electronics chassis before such cooling air flows into other portions of the electric machine or to an exit. As a result, electronics may be kept cool independently of other structure. Air flow may be input from side openings of a housing and/or through any holes formed in an end cover plate, whereupon such cooling air is routed in a generally radial direction by the air router for convection cooling of the B+ chassis, followed by generally axial movement of the air flow for convection cooling of remaining portions of the electric machine.

In an exemplary electric machine used in an automotive application, incoming air temperature may be 125 degrees Celsius, and MOSFETs of a rectifier circuit must be kept below approximately 195 degrees Celsius, and it is desirable to maintain MOSFET temperature at 150 degrees or less. Therefore, the disclosed embodiments provide a structure and method for assuring reliable performance of a rectifier circuit in the machine.

Figure 13:
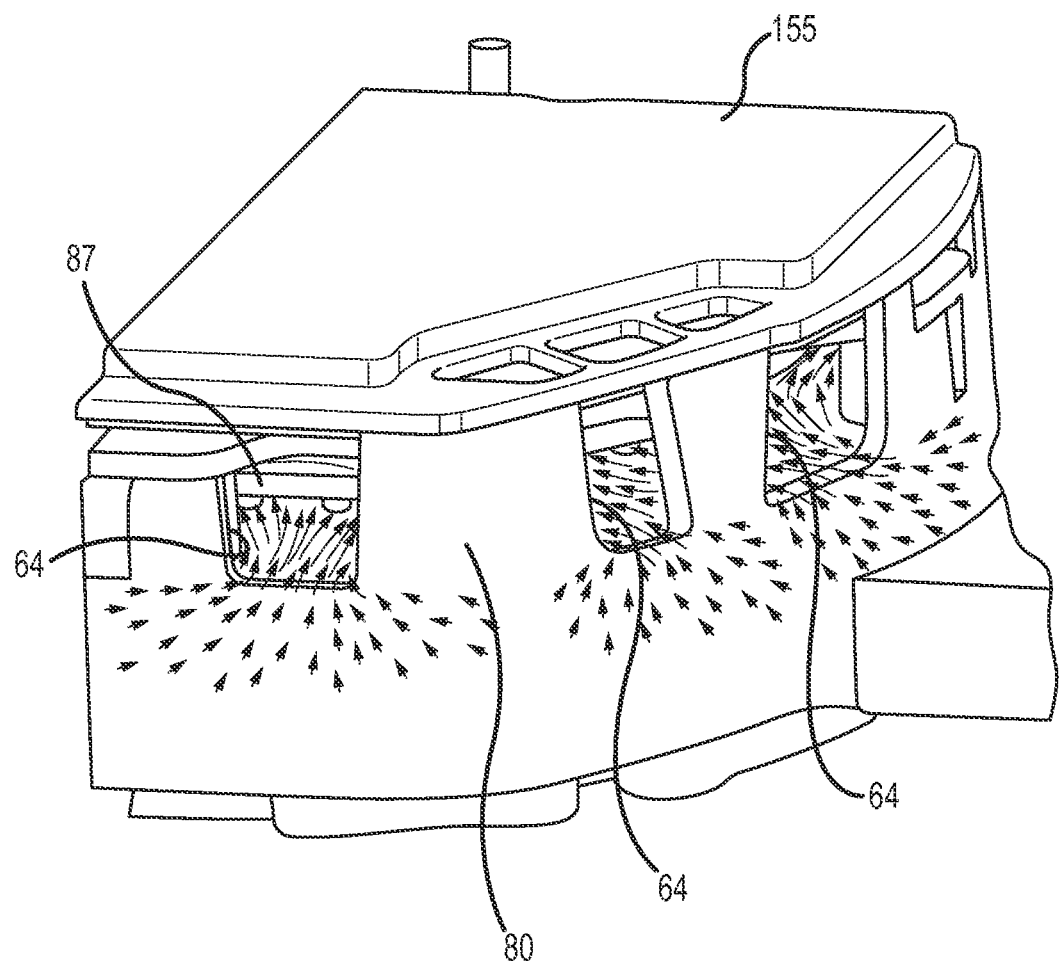
FIG. 13 is a partial perspective view of an air inlet portion of an electric machine, according to an exemplary embodiment.

FIG. 13 is a partial perspective view of an air inlet portion of an electric machine, according to an exemplary embodiment. Housing 80 has a number of cooling air intake passages 64 formed in a periphery thereof. Electronics chassis 87 may extend radially to be in relatively close proximity to the inner peripheral surfaces of housing 80, so that most of the incoming cooling air passes axially inward of chassis 87, through heat sink pins 89 (FIG. 5). When chassis 87 is formed with an electrically insulating perimeter, such as plastic over mold 113 (FIG. 5), chassis 87 is protected from electrically shorting against housing 80. Cover 155 may be formed with or without air inlet holes. The incoming air flow is kept between chassis 87 and air router 126, and is directed within cooling pins 89, by the position and structure of air router 126.

Figure 14:
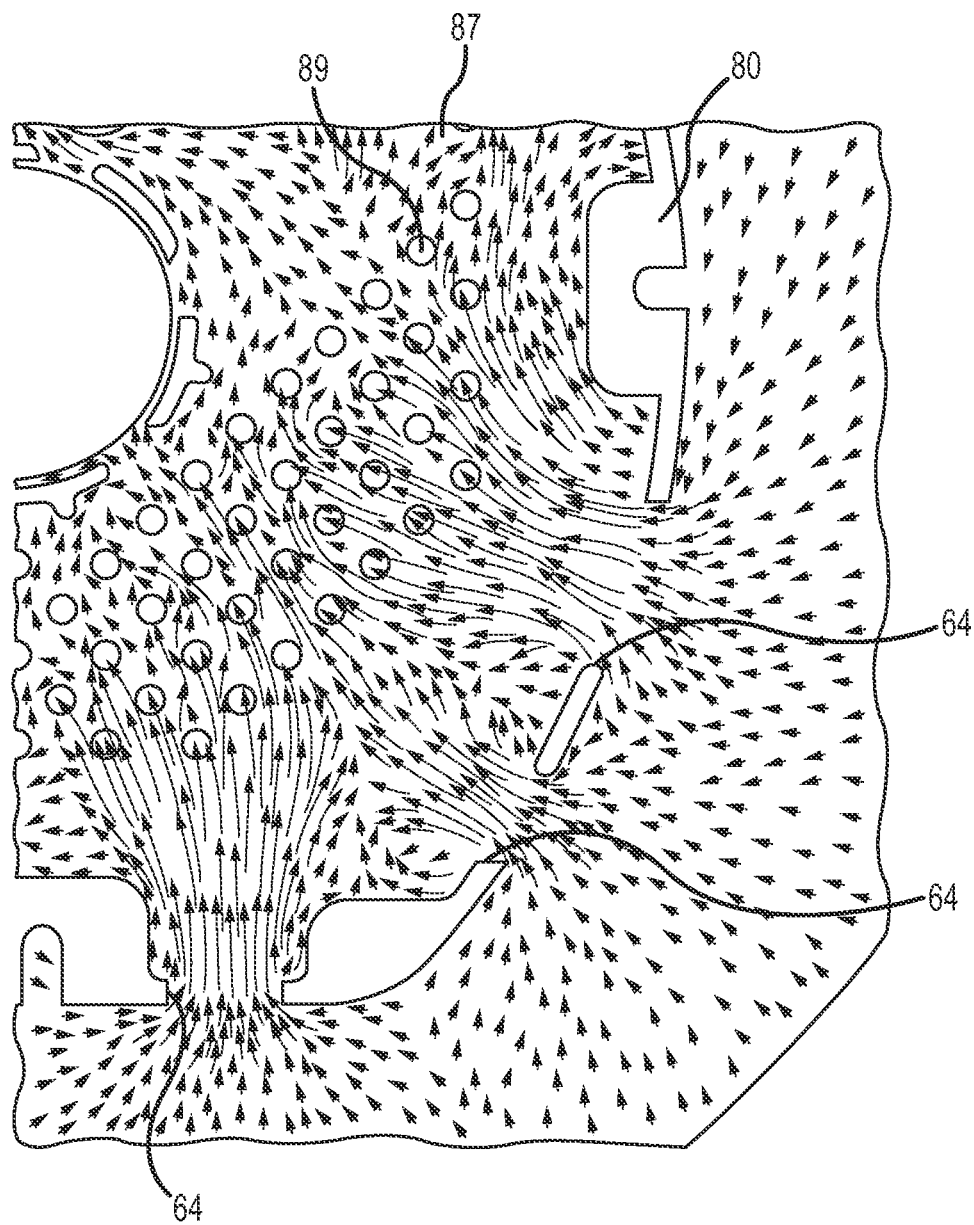
FIG. 14 is a representative air flow simulation for an electric machine having an air router and an electronics chassis, according to an exemplary embodiment.

FIG. 14 is a representative air flow simulation for an electric machine having air router 126 and electronics chassis 87, according to an exemplary embodiment. It can be seen that the incoming cooling air flow enters through cooling air intake passages 64 and proceeds directly to heat sink pins 89 of chassis 87.

While various embodiments incorporating the present invention have been described in detail, further modifications and adaptations of the invention may occur to those skilled in the art. However, it is to be expressly understood that such modifications and adaptations are within the spirit and scope of the present invention.

What is claimed is:

1. An alternator, comprising:
    a housing body;
    rectifier electronics comprising positive rectifying devices and negative rectifying devices substantially disposed in a single plane;
    an electronics chassis electrically in common with positive DC output voltage (B+) of the alternator and to which the rectifier electronics are mounted, the electronics chassis conductively isolated from heat of the housing body, and having integrally-formed cooling fins;
    a plurality of air intake openings; and
    an air router positioned substantially within the housing body and secured intermediate the housing body and the electronics chassis, the air router being structured for directing cooling air from the air intake openings to the cooling fins.

2. The electric machine of claim 1, wherein the air intake openings are formed in the housing body.

3. The electric machine of claim 1, further comprising a cover disposed at an axial end of the alternator and secured to the housing body, wherein at least some of the air intake openings are formed in the cover.

4. The electric machine of claim 1, wherein the cooling fins include a plurality of substantially annular, axially-inward-extending pins.

5. The electric machine of claim 4, wherein the pins include a radially inward pin array having relatively short pins and a radially outward pin array having relatively long pins.

6. The electric machine of claim 1, wherein the air router is a unitary plastic body.

7. The electric machine of claim 1, wherein the air router includes a plurality of channels circumferentially aligned with respective ones of the plurality of air intake openings, wherein the air router further includes an annular center portion in fluid communication with respective radially inward openings of the plurality of channels.

8. An electric machine, comprising:
    a housing body having a plurality of cooling air intake openings around its perimeter;
    an electronics chassis disposed at an axial end of the housing body, the electronics chassis having rectifier electronics mounted thereon and having integrally-formed, axially-extending cooling fins, the rectifier electronics comprising positive rectifying devices and negative rectifying devices substantially disposed in a single plane; and
    a thermally and electrically non-conductive air router substantially within the housing body and secured intermediate the housing body and the electronics chassis, the air router being structured for routing the cooling air from the air intake openings directly to the cooling fins.

9. The electric machine of claim 8, further comprising a cover attached to the axial end of the housing body.

10. The electric machine of claim 8, wherein the air router includes a plurality of radially-extending walled channels that are circumferentially aligned with respective ones of the plurality of cooling air intake openings.

11. The electric machine of claim 10, wherein the air router further includes an annular center portion, and wherein the center portion is in fluid communication with respective radially inward openings of the plurality of channels.

12. The electric machine of claim 11, wherein the air router further includes at least one aperture between each of the channels.

13. The electric machine of claim 10, wherein the air router includes at least one air dam in close axial proximity to the cooling fins.

14. The electric machine of claim 8, wherein the air router is set into the axial end of the housing body so that an interior surface of the housing body and an outer peripheral edge of the air router have a substantially air tight engagement.

15. The electric machine of claim 8, wherein the air router includes at least one axially-inward-extending standoff for axially offsetting the air router from the axial end of the housing body.

16. The electric machine of claim 15, wherein the air router further includes a center recess for axially accommodating a shaft/hub assembly of the electric machine.

17. The alternator of claim 8, wherein the electronics chassis is characterized by hot spots corresponding to locations of power electronics mounted thereon, and wherein the air router is structured for routing the cooling air first to such hot spots and then to remaining portions of the alternator.

18. An alternator, comprising:
a housing body having a perimeter and having a plurality air intake openings formed around the perimeter proximate an axial end thereof;
rectifier electronics comprising positive rectifying devices and rectifying devices substantially disposed in a single plane;
an electronics chassis electrically in common with positive DC output voltage (B+) of the alternator and to which the rectifier electronics are mounted; and
an electrically non-conductive air router secured substantially within the housing body intermediate the housing body and the electronics chassis, the air router being structured for radially channeling cooling air from the air intake openings directly to the electronics chassis.

19. The electric machine of claim 18, wherein the air router includes a plurality of channels circumferentially aligned with respective ones of the plurality of air intake openings.

20. The electric machine of claim 19, wherein the air router further includes an annular center portion in fluid communication with respective radially inward openings of the plurality of channels.

* * * * *